United States Patent

Takai

Patent Number: 5,130,677
Date of Patent: Jul. 14, 1992

[54] SIGNAL TERMINATION CIRCUIT

[75] Inventor: Atsushi Takai, Kokubunji, Japan

[73] Assignee: Hitachi, Ltd., Tokyo, Japan

[21] Appl. No.: 577,033

[22] Filed: Sep. 4, 1990

[30] Foreign Application Priority Data

Sep. 13, 1989 [JP] Japan .................. 1-235643

[51] Int. Cl.$^5$ .............................................. H01P 1/24
[52] U.S. Cl. .................................... 333/22 R; 333/32
[58] Field of Search .............................. 333/22 R, 32

[56] References Cited

U.S. PATENT DOCUMENTS 4,553,050  11/1985  Feinberg et al. ............ 333/22 R X

FOREIGN PATENT DOCUMENTS 2548207  5/1977  Fed. Rep. of Germany .... 333/22 R
2365216  5/1978  France .......................... 333/22 R Primary Examiner—Eugene R. LaRoche
Assistant Examiner—Benny Lee
Attorney, Agent, or Firm—Antonelli, Terry, Stout & Kraus

[57] ABSTRACT

A signal termination circuit comprising a resistor and a circuit network including two or more equivalent circuits connected in parallel to each other. The equivalent circuits respectively comprises resistors in the equivalent circuits, capacitors and inductances connected in series. The resistors have substantially the same resistive value.

5 Claims, 3 Drawing Sheets

SIGNAL TERMINATION CIRCUIT

BACKGROUND OF THE INVENTION

The present invention generally relates to a signal termination circuit which can be used throughout a wide range of frequency bands and which can be applied with a DC biasing voltage.

An electronic circuit for a Gb/s (giga bits/sec.) optical communication system requires a wide frequency characteristic ranging from nearly DC to a frequency substantially in the range of the desired transmission speed. For example, 2.4 Gb/s light communication requires a frequency band of from 10 kHz to 3 GHz.

In a microwave range, circuit blocks are connected to each other through a transmission line. In this case, a signal must be terminated at the input of the circuit block with a wide range of frequency band.

Meanwhile, for many reasons, such as small dimension, high reliability etc. a semiconductor integrated circuit (which will be sometimes referred to merely as the IC, hereinafter) is used. Generally speaking, the IC is mounted in a package. In a GHz frequency band, it is required to locate the signal termination within the package. Further, a biasing voltage must be applied to an input terminal of the IC; the other end of a terminating resistor must be floated with respect to DC components of the signal and be grounded with respect to high frequency components thereof.

A circuit which satisfies the above conditions is shown in FIG. 2. The illustrated circuit includes an input terminal 1 connected to the preceding stage, package pins P1 and P2, an IC 2, an IC package 3, a terminating resistor RL, a DC blocking capacitor Cb, and by-pass capacitors $Cp_1$ and $Cp_2$. The terminating characteristic of the circuit at low frequencies is determined by a total of the values of the by-pass capacitors. Generally speaking, a capacitor having an excellent high-frequency characteristic has a small capacitive value. Thus the excellent terminating characteristic throughout a wide range of frequencies is obtained by using a plurality of capacitors. FIG. 3 is a characteristic diagram of the circuit of FIG. 2 showing a relationship between terminating impedance and frequency, in the case where RL=50 Ω, $Cp_1$=80 pF and $Cp_2$=0.1 μF. It will be observed form FIG. 3 that the characteristic curve has a peak in the vicinity of 300 MHz The peak is due to the resonance which occurs between the parasitic inductances of the capacitors $Cp_1$ and $Cp_2$ and the capacitances thereof. With the circuit used in the measurement of FIG. 3, the parasitic inductances of the capacitors $Cp_1$ and $Cp_2$ were 0.4 nH and 2.5 nH respectively. Since it is actually impossible to completely eliminate these parasitic inductances, it has been impossible to remove the peak in the terminating-impedance to frequency characteristic of the system of FIG. 2.

SUMMARY OF THE INVENTION

It is an object of the present invention to provide a wide-range terminating circuit which can prevent occurrence of such a peak as shown in FIG. 3.

The peak in the curve of FIG. 3 results from the resonance between the capacitances and their parasitic inductances. For the purpose of suppressing the resonance phenomenon, damping resistors are inserted. More specifically, since the damping resistors are used as a part of a terminating resistor, the loss of the damping resistor is included in that of the terminating resistor. For that purpose, a total resistance of the damping resistors in routes extended from the signal line to the ground must be equal to the resistance of the terminating resistor. Further, when the resistance, capacitance and inductance are adjusted so that the impedance of the resonance circuit becomes resistive at the resonance frequency, the above peak can be removed from the characteristic curve.

DESCRIPTION OF THE PREFERRED EMBODIMENTS

Figure 1:
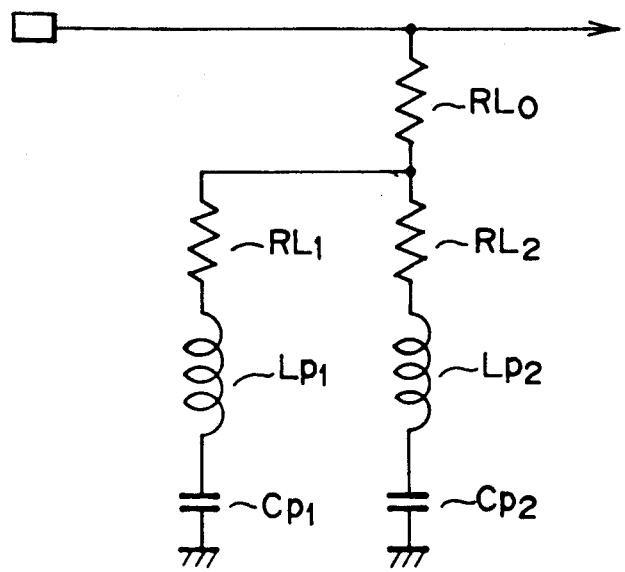
FIG. 1 is a schematic diagram for explaining the operation of a terminating circuit in accordance with an embodiment of the present invention.
Figure 2:
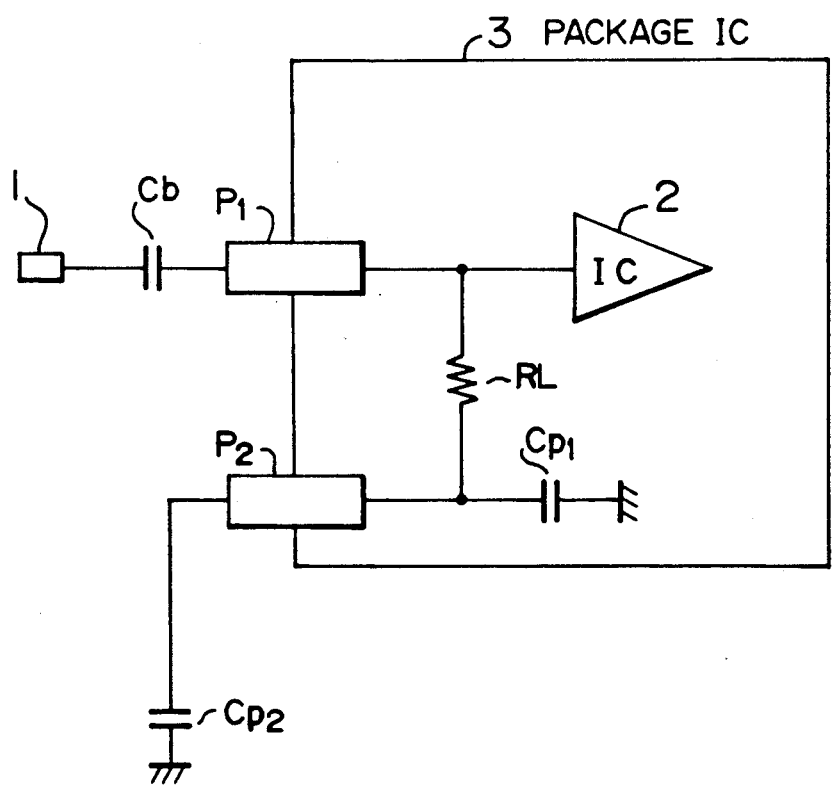
FIG. 2 is a prior art termination circuit.
Figure 3:
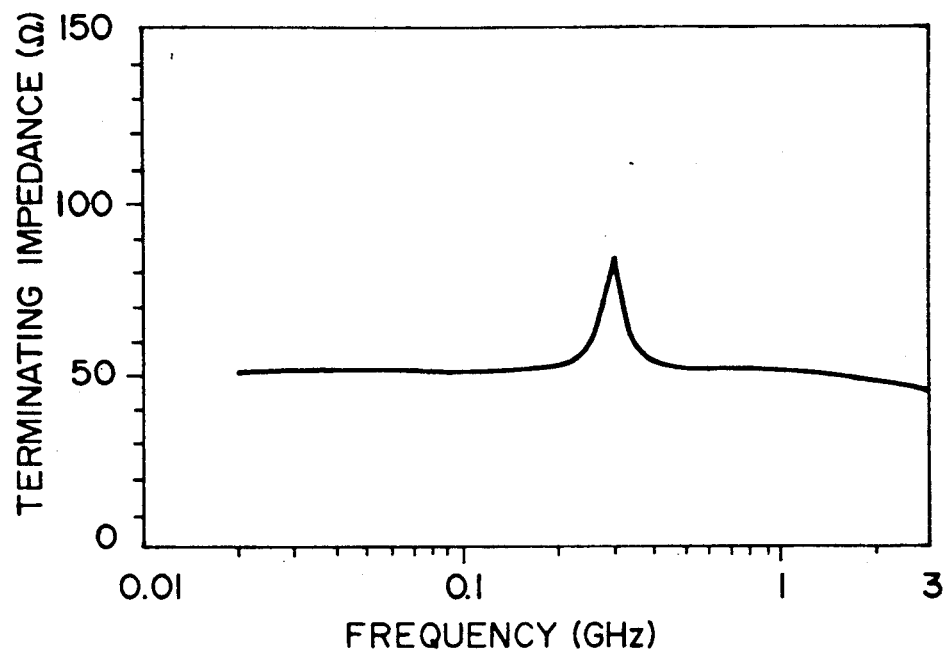
FIG. 3 is a characteristic diagram of the prior art terminating circuit of FIG. 2.

Referring to FIG. 1, there is shown a termination circuit in accordance with an embodiment of the present invention, which comprises resistors $RL_0$, $RL_1$ and $RL_2$, by-pass capacitors $Cp_1$ and $Cp_2$, and equivalent inductances $Lp_1$ and $Lp_2$ including their parasitic inductances. With such a terminating circuit, when the characteristic equations of series resonance circuits respectively comprising the capacitors $Cp_1$ and $Cp_2$, inductances $Lp_1$ and $Lp_2$ and resistors $RL_1$ and $RL_2$ connected in series are set to have real root solutions, no resonance takes place and thus such peak as mentioned earlier can be suppressed. When the above characteristic equations are set to have an equal root solution, the terminating characteristic of the terminating circuit can be made flat throughout a wide frequency band. When the following relationship (1) is satisfied, the characteristic equations can have an equal root solution.

$$RL_1 = RL_2 = \sqrt{Lp/Cp} \qquad (1)$$

where Cp and Lp denote series sums of $Cp_1$ and $Cp_2$ and $Lp_1$ and $Lp_2$ respectively. When the following relation (2) is satisfied, the frequency characteristic of the terminating impedance (having a value of RL) becomes flat.

$$RL_0 = RL - RL_1 \qquad (2)$$

It will be obvious that the above can be applied even to the case where there are three or more capacitors. In other words, the resistances, capacitances and inductances are set so that circuit loops comprising two of the three or more capacitors meet the aforementioned real or equal root condition. Another inductance is the added parasitic inductance of the capacitor and the wiring necessary to meet the equation (1).

Further, it is generally speaking difficult to connect a voltage source to a signal line without causing any degradation of the high frequency characteristic for the purpose of applying a biasing voltage. With the circuit of the present invention, on the other hand, since frequency components are grounded through respective capacitors, a voltage source can be connected to one of the circuit routes which contains a damping resistor, a capacitor and an inductance and which grounds low frequency components therethrough. In this case, high frequency components pass through another capacitor, and thus the terminating circuit is not affected by the connection of the voltage source.

Further, in the event where it is desired to place a signal termination within a IC package, when only high frequency components of a signal are grounded in the package and the grounding of low frequency components thereof requiring a large capacitance is carried out outside a package, there can be realized such a package that can be made small in size and simple in configuration without causing any deterioration of its high frequency characteristic. In this connection, the value of a damping resistor for the low frequency components must be set to be substantially the same as that of a damping resistor for the high frequency components. However, this can be facilitated by also incorporating the low-frequency damping resistor in the IC package to allow design of a peripheral circuit of the IC without any need for measuring a variation in the incorporated resistor.

Figure 4:
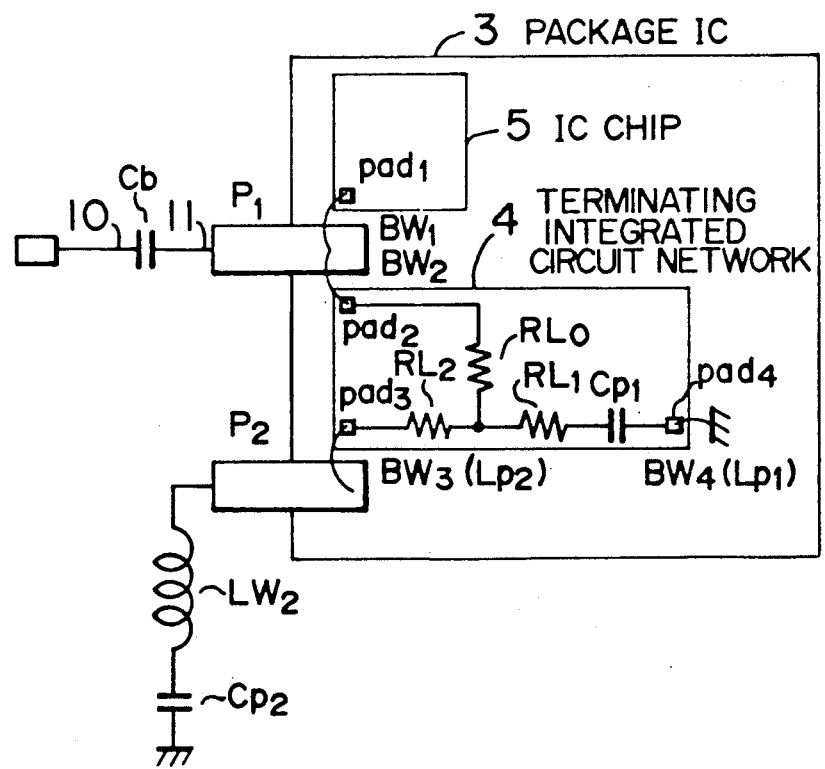
FIG. 4 is a specific embodiment of the termination circuit of the present invention.

FIG. 4 shows a detailed example of a signal terminating circuit in accordance with the embodiment of the present invention, which circuit includes distribution lines 10 and 11 each having a characteristic impedance of 50 Ω, a package IC 3, a DC blocking capacitor Cb and a capacitor $Cp_2$ having a capacitive value of 0.1 μF. The packaged IC 3 comprises an IC chip 5, a terminating integrated circuit network 4, an input signal pin P1 matched at 50 Ω, a low-frequency terminating pin P2, a $pad_1$ for input of a signal to the IC chip 5, $pad_2$, $pad_3$ and $pad_4$ for connection of the terminating integrated circuit network 4, bonding wires BW1 and BW2 for connection between the pin $P_1$ and $pad_1$ and $pad_2$, a bonding wire BW3 for connection between the pin $P_2$ and $pad_3$, and a bonding wire BW4 for connection between the $pad_4$ and earthing ground. The terminating integrated circuit network 4 has resistors $RL_0$, $RL_1$ and $RL_2$, and a grounding capacitor $Cp_1$ having a capacitive value of 80 pF.

An inductance $Lp_1$ in series with the grounding capacitor $Cp_1$ corresponds to a parasitic inductance of the bonding wire BW4 and has an inductive value of 0.4 nH. An inductance $Lp_2$ in series with the grounding capacitor $Cp_2$ corresponds to a total of parasitic inductances of the bonding wire BW3 and pin $P_2$ and parasitic inductance $LW_2$ between the pin $P_2$ and grounding capacitor $Cp_2$ and has an inductive value of 2.5 nH. In the present embodiment, a characteristic equation for the series resonance of the grounding capacitor $Cp_1$ and $Cp_2$ is expressed as follows.

$$Lp \cdot s^2 + 2 \cdot RL_1 \cdot s + 1/cp_2 = 0$$

where $Lp = Lp_1 + Lp_2 = 2.9$ nH and $Cp = Cp_1 // Cp_2 = 79.9$ pF (where symbol // indicates series connection). When the following relationship is satisfied, the above equation has an equal root solution.

$$(RL_1)^2 - Lp/Cp = 0$$

Hence this equation is rewritten as $$RL_1 = \sqrt{Lp/Cp} = 6 \, \Omega$$

When $RL_0 = 44 \, \Omega$, $RL_1 = 6 \, \Omega$ and $RL_2 = 6 \, \Omega$, the terminating resistance can be set at 50 Ω throughout a wide range of frequency band.

Figure 5:
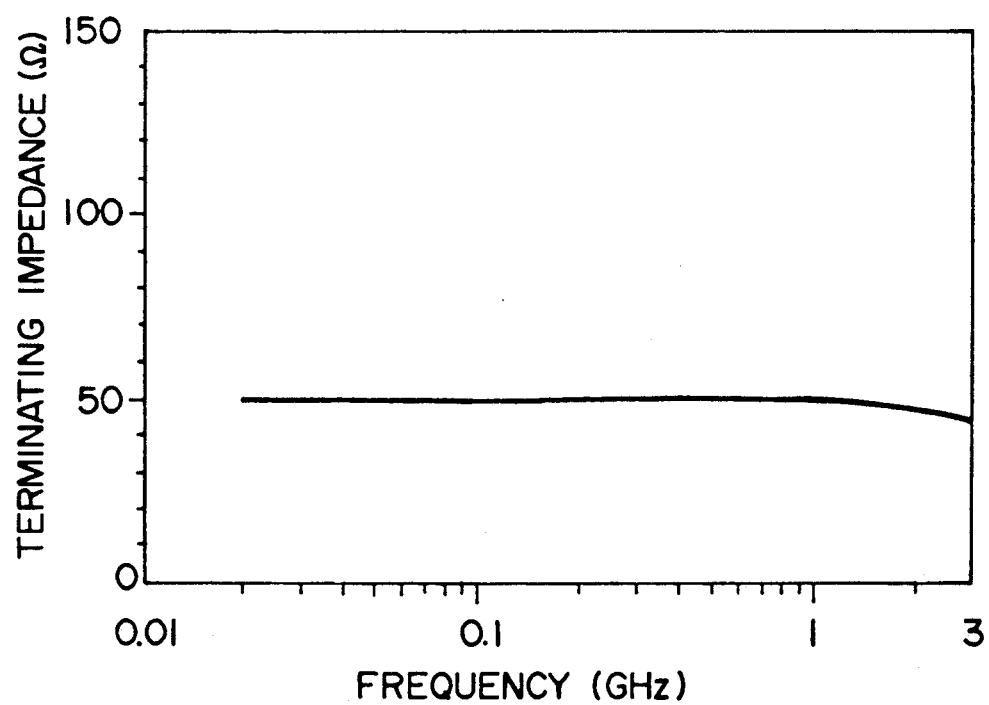
FIG. 5 is a characteristic diagram of the termination circuit of FIG. 4.

The terminating impedance characteristic of the present embodiment is shown in FIG. 5, in which a terminating impedance curve is flat up to 30 GHz.

In the present invention since an input biasing voltage can be obtained from the IC chip, it is unnecessary to connect any external voltage source to the circuit of the invention. However, it is desired to apply an external input biasing voltage, the voltage source $V_s$, as shown in FIG. 4, can be connected to one end of the capacitor $Cp_2$. Since the capacitor $Cp_2$ passes only frequency components below 500 MHz therethrough, in this case, an about 500 MHz wiring technique may be used for that purpose.

As has been disclosed in the foregoing, in accordance with the present invention, since a terminating resistor is divided into a plurality of resistors to be used as damping resistors, a flat terminating characteristic can be realized throughout a wide range of frequency band. In addition, since signal frequency components are divided into a plurality of groups as terminated, a biasing voltage can be applied with use of a relatively low-frequency wiring technique while not affecting the high frequency characteristic.

What is claimed is:

1. A signal termination circuit comprising:
    a circuit network including two or more circuits connected in parallel to each other, said circuits respectively comprising resistors, grounding capacitors and parasitic inductances connected in series, said resistors in each circuit having substantially the same resistive value; and
    a second resistor, one terminal of the second resistor being connected to said circuit network, and another terminal of the second resistor being connected to an input signal line.

2. A signal termination circuit as set forth in claim 1, wherein a voltage source is connected to one of said circuits of said circuit network.

3. An integrated circuit package including a signal termination circuit comprising first, second and third resistors and a grounding capacitor, said first resistor having one terminal connected with a signal line and another terminal connected with said second and third resistors, said second resistor having a terminal connected with said grounding capacitor, and said third resistor having a terminal connected with an external circuit comprising an inductance and another grounding capacitor.

4. A signal termination circuit comprising:
    a first resistor coupled to an input signal line;
    a first circuit coupled to the first resistor, comprising a second resistor, a first grounding capacitor and a first parasitic inductance coupled in series; and
    a second circuit coupled to the first resistor, comprising a third resistor, a second grounding capacitor and a second parasitic inductance coupled in series, the resistive value of the third resistor being substantially equal to that of the second resistor.

5. An integrated circuit package comprising:
    an integrated circuit coupled to an input signal line; and
    a signal termination circuit comprising a first resistor coupled to the input signal line, a second resistor, with a grounding capacitor coupled in series therewith, coupled to the first resistor, a third resistor coupled to the first resistor, and means for coupling the third resistor to an external circuit comprising an inductance and a grounding capacitor.

* * * * *